United States Patent [19]
Aihara

[11] Patent Number: 5,376,895
[45] Date of Patent: Dec. 27, 1994

[54] CONTROL CIRCUIT AND METHOD FOR TRANSMISSION OUTPUT

[75] Inventor: Yukichi Aihara, Kawasaki, Japan

[73] Assignee: Matsushita Electric Industrial Co., Ltd., Osaka, Japan

[21] Appl. No.: 977,156

[22] Filed: Nov. 16, 1992

[30] Foreign Application Priority Data

Nov. 29, 1991 [JP] Japan .................. 3-315750

[51] Int. Cl.⁵ .............................................. H03G 3/20
[52] U.S. Cl. ...................................... 330/129; 330/133; 330/134; 330/279; 455/126
[58] Field of Search ............... 330/127, 129, 133, 134, 330/279; 375/60, 71, 98; 455/116, 126, 127

[56] References Cited

U.S. PATENT DOCUMENTS

| | | | |
|---|---|---|---|
| 4,592,073 | 5/1986 | Watanabe | 455/126 X |
| 4,602,218 | 7/1986 | Vilmur et al. | 330/279 |
| 5,101,176 | 3/1992 | Norimatsu | 330/134 X |
| 5,121,081 | 6/1992 | Hori | 330/279 |
| 5,128,629 | 7/1992 | Trinh | 455/127 X |

FOREIGN PATENT DOCUMENTS

| | | |
|---|---|---|
| 0261967A2 | 3/1988 | European Pat. Off. . |
| 0369135A2 | 5/1990 | European Pat. Off. . |
| 0472330A2 | 2/1992 | European Pat. Off. . |
| 0509733A2 | 10/1992 | European Pat. Off. . |
| 4100426 | 4/1992 | Japan . |

*Primary Examiner*—James B. Mullins
*Attorney, Agent, or Firm*—Stevens, Davis, Miller & Mosher

[57] ABSTRACT

A control circuit for a transmission output is used in a TDMA system radio transmitter or the like and can control a transmission output burst wave stably with high accuracy over a wide range. There is provided a closed loop system in which part of the transmission output is taken out and detected to be compared with a reference voltage to control a power amplifier and an open loop system for controlling a drive amplifier connected to an input of the power amplifier, so that a wide range operation of the transmission output and multi-stage control are attained by combining controls of both the loops.

19 Claims, 7 Drawing Sheets

F I G. 4
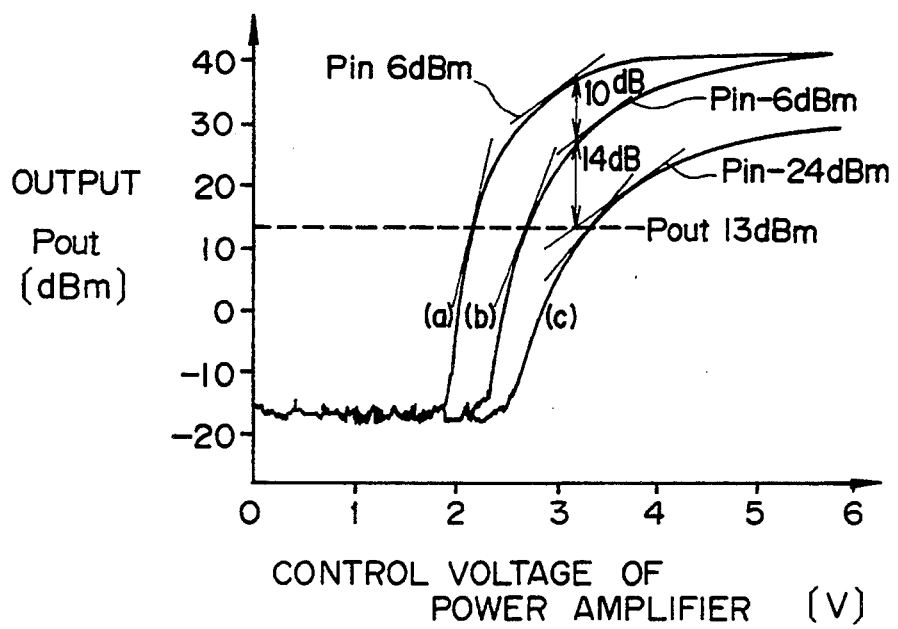
F I G. 5
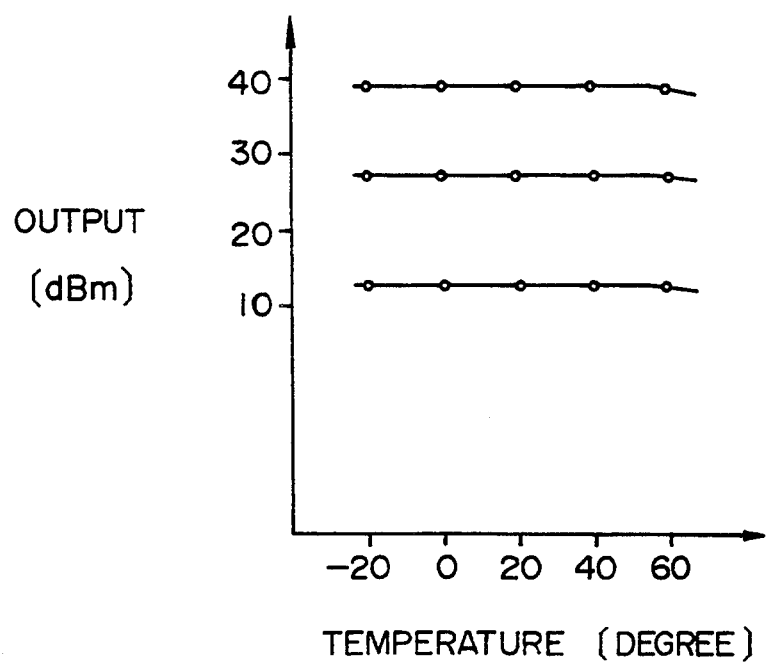

CONTROL CIRCUIT AND METHOD FOR TRANSMISSION OUTPUT

BACKGROUND OF THE INVENTION

The present invention relates to a control circuit for a transmission output of a radio transmitter or the like, and more particularly, to a control circuit suitable for a TDMA transmitter requiring stable control with high precision over a wide dynamic range.

Heretofore, the control circuit for the transmission output of this type frequently uses a closed-loop system which detects part of the transmission output to feed the detected output back to a power amplifier (see for example, U.S. Pat. No. 4,602,218).

The control circuit for the transmission output as shown in FIGS. 11 and 12, for example, are known.

In FIG. 11, an output signal produced by an oscillation source 1 is supplied to a power amplifier 3 (power amplifier system) to drive the power amplifier so that a transmission output (TX) is obtained. Part of the transmission output is taken out by a directional coupler 4 and is detected by a detector 7. A detected output (Vdet) of the detector 7 is compared with a reference output (Vref) in a comparison error amplifier 9 and an output of the comparison error amplifier 9 controls the power amplifier 3 as a control voltage (Vcont). In this manner, a feedback system (detection system) is formed. Numeral 8 represents a waveform of a reference output in the form of burst.

Further, in Japanese Patent Application No. 2-219215 (JP-A-4-100426) shown in FIG. 12, a variable attenuator 5 is connected between the directional coupler 4 and the detector 7 to vary an amount of attenuation of the variable attenuator 5 in accordance with a value of the transmission output, so that an input level of the detector 7 is maintained constant so that the detection system can attain stable control over a wide dynamic range.

However, in the first conventional circuit shown in FIG. 11, when it is applied to a TDMA transmitter to produce the transmission output in the form of burst, it is difficult to make short rising and falling characteristics of the transmission output and adjust the transmission output over a wide range since dynamic ranges of both of the detection system and the power amplifier system are narrow. Further, there is a problem that the stability including a temperature characteristic of an output is lacking in a small output.

In the second conventional circuit configuration shown in FIG. 12, a dynamic range of control of the detection system is broadened and accordingly the stability and the reproducibility are improved, while since a dynamic range of the power amplifier system is the same as that of FIG. 11, there is a problem that overshoot and unnecessary oscillation occur in rising of the burst output. Further, the stability of a temperature characteristic of the transmission output is not sufficient.

SUMMARY OF THE INVENTION

It is an object of the present invention to solve the above problems in the prior art and to provide a control circuit for a transmission output which can attain control from a low output to a high output with high accuracy and obtain a transmission burst output having high-degree stability and reproducibility.

In order to achieve the above object, according to the present invention, a drive stage having a variable output is provided before the power amplifier and an output of the power amplifier is detected through variable amplifier means. The detected output is compared with a reference voltage to control the power amplifier in accordance with an error voltage produced by the comparison. Further, the drive stage, the variable amplifier means and the reference voltage are controlled by a control signal corresponding to a desired transmission output.

According to the present invention, since both of a power amplifier system including a drive amplifier and a detection system are controlled independently in accordance with the transmission output as an open loop for the former and as a closed loop for the latter, respectively, the dynamic ranges of both the systems are broadened and control with high accuracy and high stability can be attained over a wide range of the output.

BRIEF DESCRIPTION OF THE DRAWINGS

FIG. 4 is a diagram illustrating output characteristics versus an actually measured control voltage of the apparatus of FIG. 1;

FIG. 5 is a diagram illustrating temperature characteristics of the output of the apparatus of FIG. 1;

DESCRIPTION OF THE PREFERRED EMBODIMENTS

Figure 1:
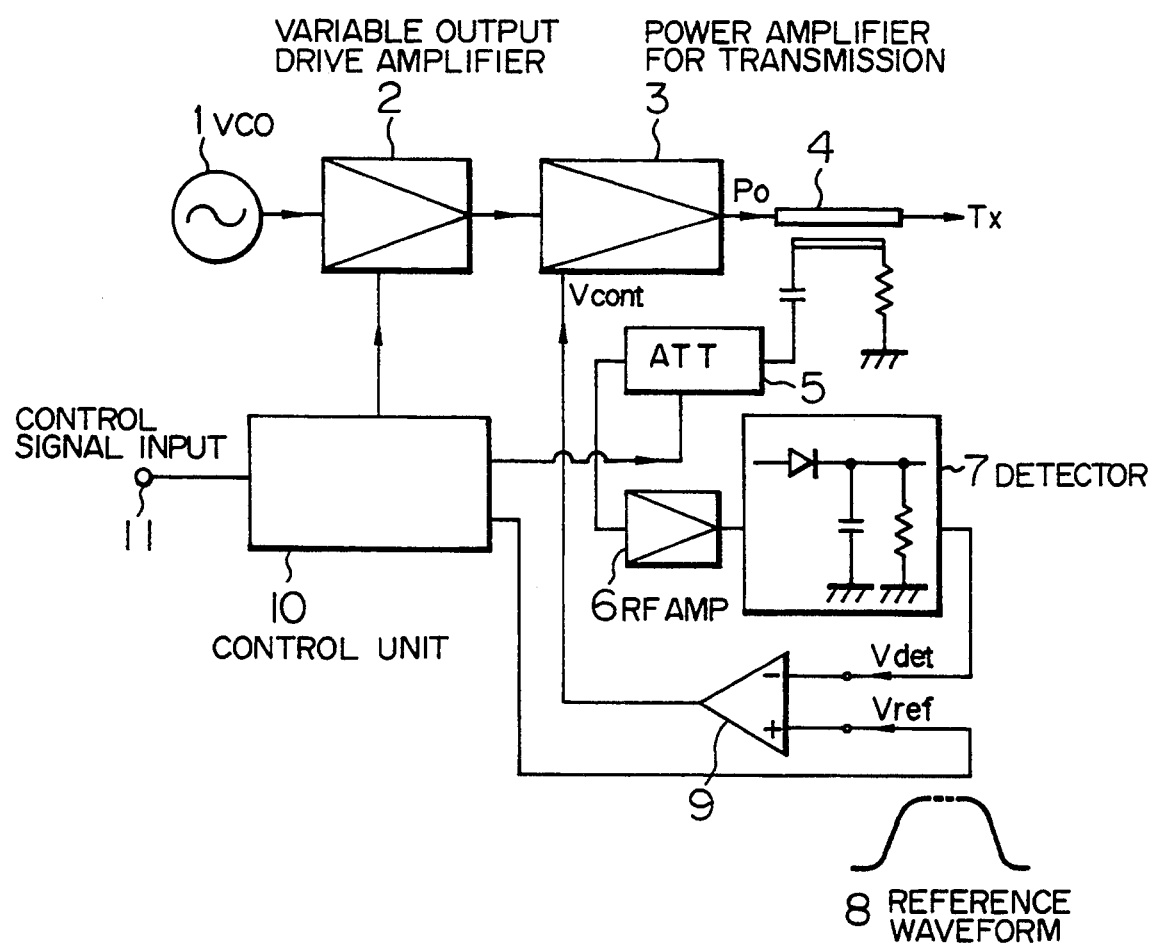
FIG. 1 is a block diagram of a control apparatus for a transmission output according to an embodiment of the present invention.

FIG. 1 schematically illustrates an embodiment of the present invention. In FIG. 1, numeral 1 denotes an oscillation source of a transmission output including a VCO (voltage control oscillator), 2 a variable output drive amplifier described later, 3 a power amplifier (for transmission), 4 a directional coupler, 5 a variable attenuator (ATT) of which an attenuation factor is controlled by a control unit 10, 6 a high-frequency amplifier (RFAMP), 7 a detector including a diode, 9 a comparison error amplifier for comparing an output (Vdet) of the detector 7 with a reference voltage (Vref), 10 a control unit which controls the variable output drive amplifier 2, the ATT 5 and the reference voltage (Vref)

in accordance with a control signal input 11, and 8 a burst reference waveform.

Operation is now described with reference to FIGS. 1 to 4. In FIG. 1, part of an output of the power amplifier 3 is derived from the directional coupler 4 and is supplied to the ATT 5. The attenuation factor of the ATT 5 is controlled to be varied in accordance with a digital control signal of four bits, for example, supplied as the control signal input 11 through the control unit 10. Such a digital control signal is frequently sent from a base station (e.g., a station for mobile communication) and is decoded in the control unit. An output of the ATT 5 is supplied through the high-frequency amplifier 6 to the detector 7. At this time, the attenuation factor of the ATT 5 and the amplification degree of the high-frequency amplifier 6 are controlled to make an input supplied to the detector 7 constant regardless of the transmission output (Po). An output (Vdet) of the detector 7 and the reference voltage (Vref) are successively compared in the comparison error amplifier 9 composed of a comparator and an output of the power amplifier 3 is controlled by an error voltage (Vcont) of the comparison error amplifier 9. In this manner, the directional coupler 4, the variable attenuator 5, the high-frequency amplifier 6, the detector 7, the comparison error amplifier 9 and the power amplifier 3 constitute a closed feedback loop for the detection system. The reference voltage (Vref) is of a burst form as shown by the reference waveform 8 and is supplied from the control unit 10 as a voltage having a peak value varying in response to the transmission output Po.

Figure 9:
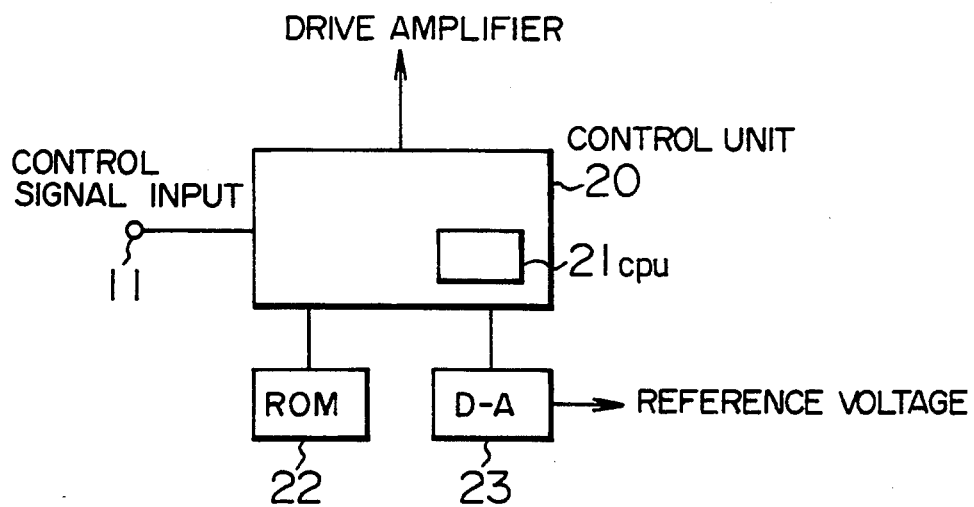
FIG. 9 is a diagram schematically illustrating another configuration example of a control unit.

On the other hand, as the reference voltage of the comparison error amplifier, a control signal having a rising and falling waveform of the transmission burst wave is applied. More particularly, as shown in FIG. 9, data stored previously in a ROM 22 of a control unit 20 is read out in synchronism with a transmission timing and is supplied through a D-A converter 23 as an analog waveform signal. Accordingly, for example, if all of transmission output level information are applied as digital control signals, the burst waveform control signal is fixed and the ROM can be economized. In FIG. 9, a CPU 21 is used in the control unit 21.

Further, the ATT 5 and the high-frequency amplifier 6 constitute a variable amplifier. The high-frequency amplifier 6 constituting the variable amplifier in the feedback loop can be omitted if a sufficiently large detection voltage can be derived.

FIG. 4 shows an output control characteristic of the power amplifier 3 measured while an input drive level is varied. If a degree of variation of an output to a control voltage is defined as a control sensitivity, it is desirable that the control sensitivity is fixed regardless of the output in order to broaden the dynamic range. For example, if the drive level is changed to that corresponding to the curve (b) from the curve (a) of FIG. 4 correspondingly when the output is required to be reduced by 10 dB, the control sensitivity is not changed. Further, when the output is required to be reduced by 24 dB, the drive level is changed to that corresponding to the curve (c) to maintain the control sensitivity to be fixed.

Figure 2:
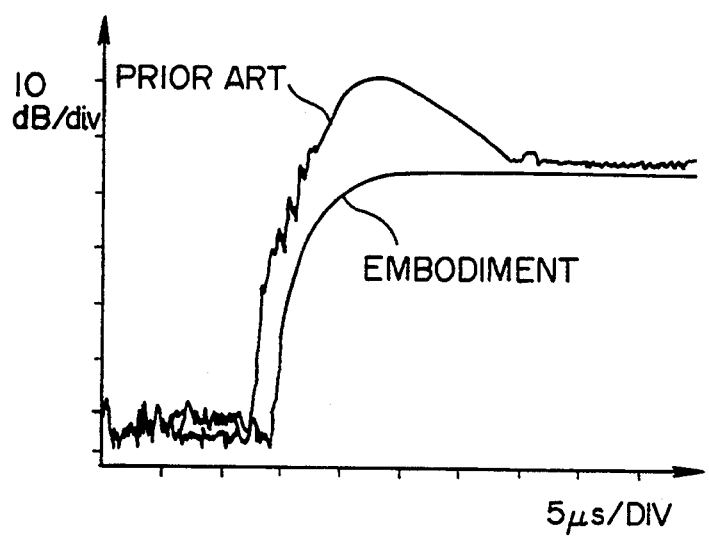
FIG. 2 is a waveform diagram illustrating characteristics of the apparatus of FIG. 1.

When the drive levels satisfying such a condition are obtained for each output level and values thereof are supplied to the power amplifier 3 as drive inputs, a lumping waveform of the output burst is improved as shown in FIG. 2. Overshoot and unnecessary oscillation are improved, the same control sensitivity is maintained for all power level basically, and the operation level of the detection system is also fixed.

Particularly, when the operation level of the detection diode is fixed and the detected voltage is also used in several volts at the maximum, the output control is extremely stable and the dependency on temperature in surroundings is very small, so that there is a large advantage that temperature compensation is not required over all output levels. Generally, a relation of a forward current and voltage of a diode is influenced by a voltage drop by an internal resistance of the diode in a large current area, while since the voltage drop possesses a positive temperature coefficient which is canceled by a negative temperature coefficient of the forward current, there is a tendency that the influence is effectively small and use in the large current are is desirable.

Figure 3:
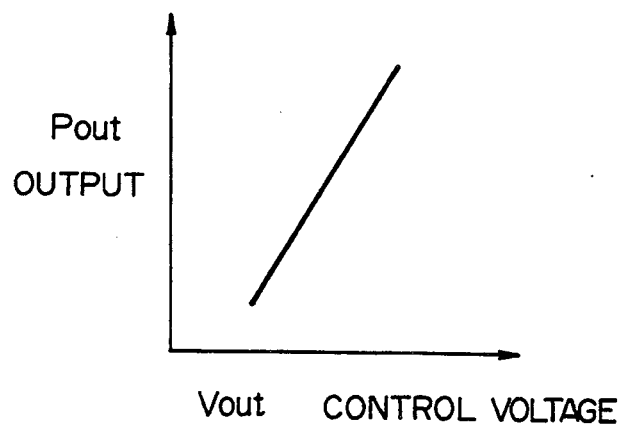
FIG. 3 is a diagram illustrating an output characteristic versus an ideal control voltage of the apparatus of FIG. 1.

On the other hand, the control sensitivity of the power amplifier system is considered as another element of the control system. When a relation of the output versus the control voltage is fixed with straight slope as shown in FIG. 3, the control sensitivity of the power amplifier is fixed regardless of the output and is coincident with the fixed control sensitivity of the detection system, so that the transmission output can be controlled only by the closed loop composed of the power amplifier system, the detection system and the comparison error amplifier over a wide dynamic range from small power to large power. However, generally, a relation of the output versus the control voltage of the power amplifier is saturated in the vicinity of the maximum output as shown by the curve (a) of FIG. 4 and the control sensitivities of the output levels, that is, tangential lines are varied greatly. Particularly, when the output is reduced, the control sensitivity is suddenly increased and oscillation occurs in the control loop. The oscillation in the closed loop can be stopped by slowing the response of the loop, whereas the burst waveform can not be controlled in the vicinity of the maximum power and effect of automatic output control (APC) for variation in the supply voltage and the input level can be expected.

Figure 6:
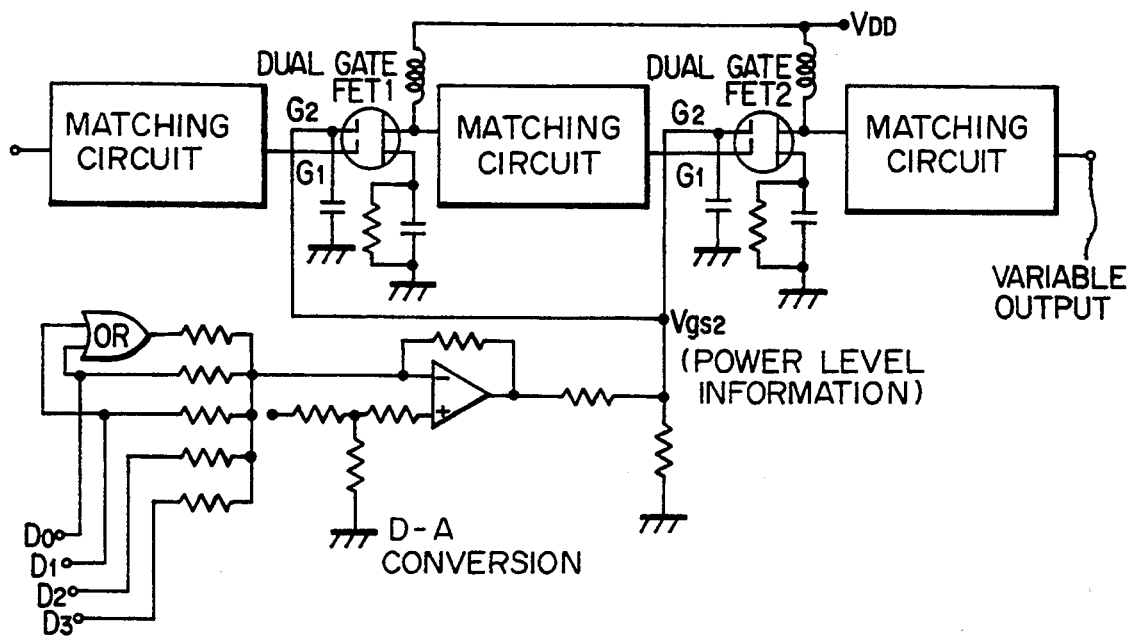
FIG. 6 is a block diagram schematically illustrating a configuration of a variable output drive amplifier of the apparatus of FIG. 1.

FIG. 6 schematically illustrates an actual configuration of the variable output drive amplifier 2. The drive amplifier includes matching circuits provided at input and output sides and an intermediate portion and two cascade-connected FET's connected between the respective matching circuits. An RF signal is supplied to a first gate G1 of the respective FET's which is held at a fixed bias and a second gate G2 is used as a control terminal. A level variation amount per transistor is 15 to 20 dB and two-stage configuration is adopted in order to vary the level by 30 dB or more by way of example. A MOS dual gate FET is best as an FET element if importance is attached to the IM distortion of the amplifier, while a GaAs dual gate amplifier may be used as a mere level variable amplifier. Generally, when the control current is extremely reduced, it may be a gate controlled FET amplifier. If a mere current booster is provided to attain the collector voltage control, the control range, the reality and the stability are deteriorated and there is almost no merit.

Figure 7:
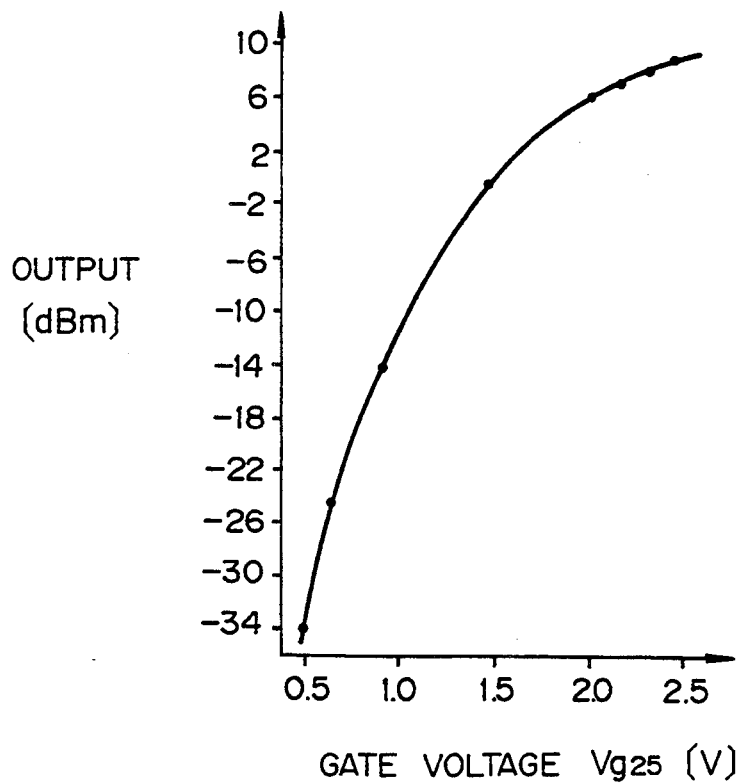
FIG. 7 is a characteristic diagram illustrating a relation of an output and a gate control voltage of the apparatus of FIG. 1.

FIG. 7 is a graph showing a characteristic of an output level versus a gate voltage in the two-stage dual-gate FET configuration.

Figure 8:
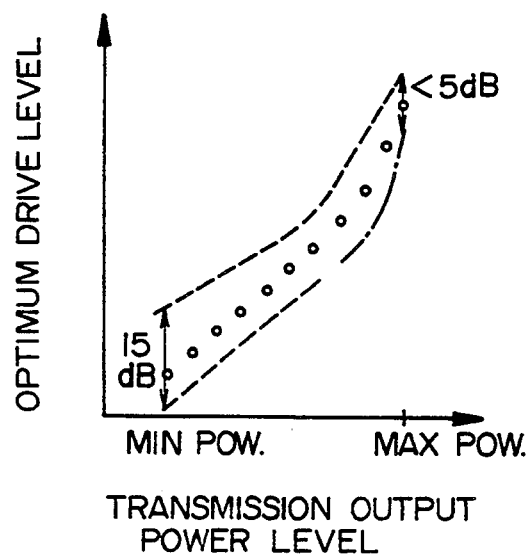
FIG. 8 is a characteristic diagram illustrating a relation of an optimum drive level and a transmission output of the apparatus of FIG. 1.

On the other hand, the optimum drive input level to the output levels of the power amplifier 3 is varied with a relation as shown in FIG. 8, for example, and there is an allowable width in this value to a certain extent.

More particularly, the optimum drive level to the transmission output level is not required to be set to a specific level strictly, while it is desirable that the optimum drive level is set within a predetermined range.

The variable output drive amplifier 2 is supplied with a gate bias in accordance with the output level by means of designation from the control unit 10, while as an embodiment, when the output level information is given by 4-bit digital value, a circuit including a D-A converter constituted by a simple operational amplifier as shown in FIG. 6 may be used. An OR circuit of FIG. 6 serves to increase the drive level at the highest output level. D0, D1 indicate upper bits, which take low level for high power output levels. The D-A conversion characteristic is adapted to increase the analog output particularly for such high power output levels. With such a configuration, the rapidly increased optimum drive level upon the high transmission output as shown in FIG. 8 can be treated.

Figure 10:
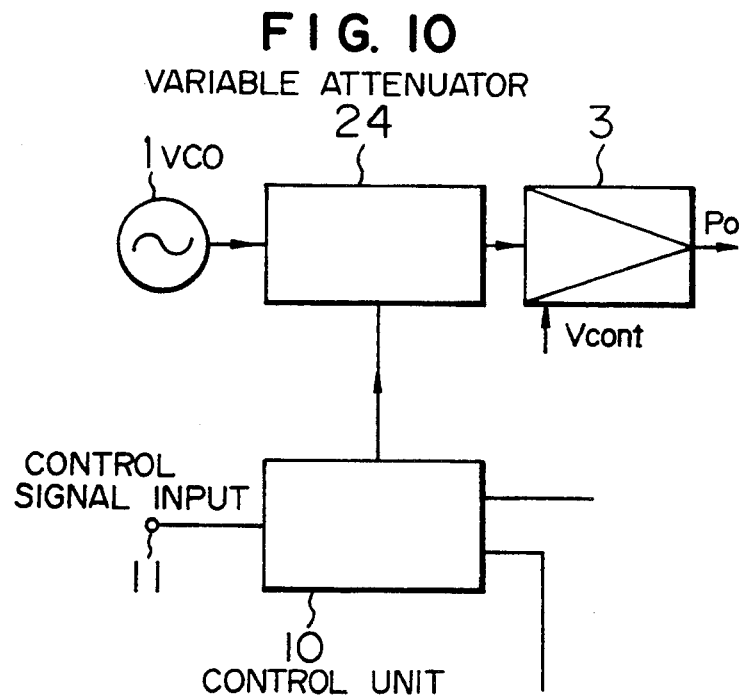
FIG. 10 is a diagram schematically illustrating another configuration example of a drive stage.
Figure 11:
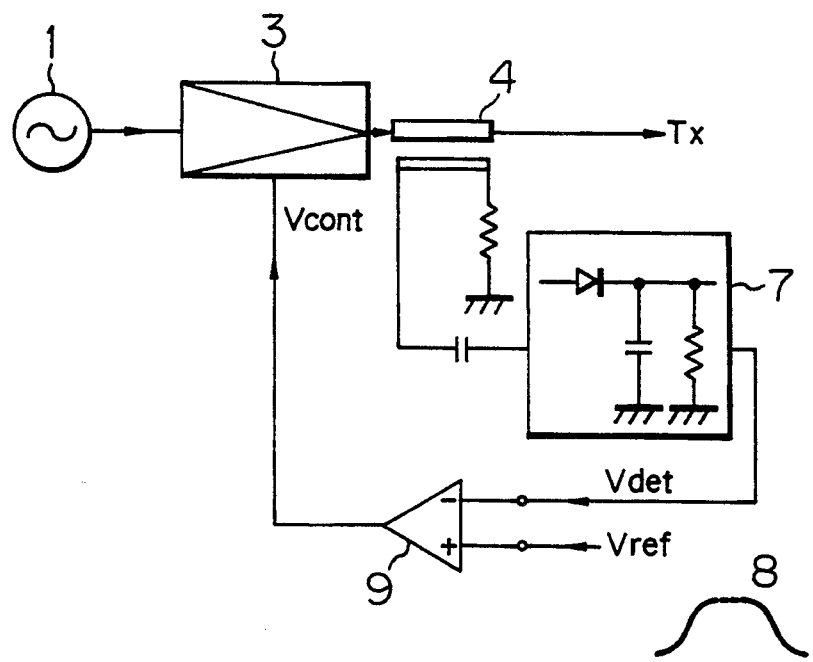
FIG. 11 is a block diagram schematically illustrating a configuration example of a conventional control circuit for a transmission output.
Figure 12:
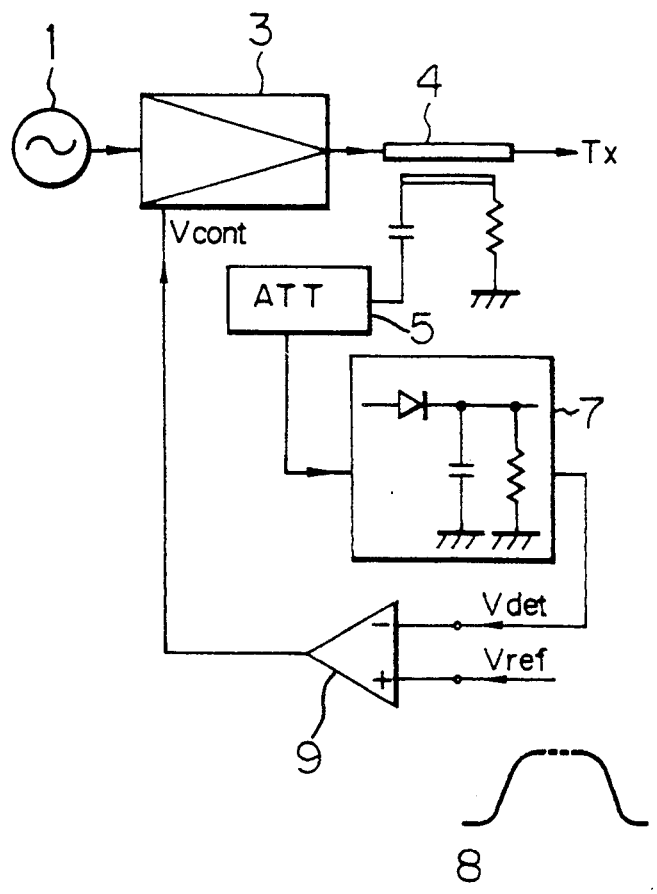
FIG. 12 is a block diagram schematically illustrating a configuration example of another conventional control circuit of a transmission output.

On the contrary, the amplification degree of the drive amplifier is suppressed upon the low output and the drive amplifier operates as an attenuator rather than an amplifier. An example of such a drive stage is shown in FIG. 10. In FIG. 10, numeral 24 denotes a variable attenuator. Further, when strictness is required for the dynamic range, the variable attenuator 24 and the variable output drive amplifier 2 may be switched in accordance with the output level.

Such a variable output drive amplifier 2 is connected to the input of the power amplifier 3 to attain the open loop control, so that the control sensitivity of the power amplifier can be maintained substantially constant and stable transmission burst waveform control can be attained over all output levels.

When an input level of the drive amplifier 2 is 0 dB, the level distribution of the input (Pin) and the output (Pout) of the power amplifier 3 upon the optimum minimum output and maximum output are as follows:

| Pout | Pin |
| --- | --- |
| 15 dBm | −25 dBm |
| 41 dBm | 6 dBm |

As is apparent from the above embodiment, according to the present invention, two sets of loops having the closed loop control in which the variable attenuator is connected after the transmission output coupler to maintain the control sensitivity of the detection system to be constant with respect to variation of the transmission output and the open loop control in which the variable output level drive amplifier is connected before the power amplifier to open-loop control the drive level are combined, so that the transmission output can be controlled with a constant control sensitivity over all output level. Consequently, not only control over a wide range of the transmission output level but also high-speed control over a wide dynamic range such as waveform control of rising and falling of the transmission burst waveform are possible. Further, since the operation level of the detection system is constant, there are large effects that operation is very stable, the reproducibility is high, the dependency on temperature in surroundings is small and the temperature compensation is not required over all output level. In addition, unnecessary oscillation occurring generally in small transmission power is not produced according to the present invention and high-speed and stable control is possible.

I claim:

1. A control circuit for a transmission output generated through variable output drive amplifier means, to be driven by a high-frequency signal from an oscillation source, and controllable power amplifier means cascade-connected to said drive amplifier means, said control circuit comprising:
   a feed back loop including detection means for detecting part of the transmission output to provide a detected output, and variable amplifier means receiving said detected output and providing an amplified detected output, a comparator means for comparing said amplified detected output with a reference signal and providing a difference output, indicating a difference between said amplified detected output and said reference signal, for controlling said power amplifier means; and
   a feed forward control loop including a control means for producing a first output signal to control said variable amplifier means and a second output signal to control said drive amplifier means in accordance with a control signal that represents a desired transmission output and that is input to said control means.

2. A control circuit according to claim 1, wherein said variable amplifier means includes a variable attenuator controlled by said first control signal produced by said control means.

3. A control circuit according to claim 2, wherein said reference signal is a variable reference voltage and said control means generates said variable reference voltage in accordance with said control signal input to said control means.

4. A control circuit according to claim 1, wherein said variable amplifier means includes a high-frequency amplifier having a fixed amplification degree.

5. A control circuit according to claim 1, wherein said control means generates said second control signal to cause an output of said drive amplifier means to increase for a high power level of said transmission output as compared with that for a lower power level of said transmission output.

6. A control circuit according to claim 1, wherein said control means includes a digital circuit and a digital-to-analog converter for converting an output of said digital circuit into said first control signal and said second control signal.

7. A control circuit according to claim 1, wherein said drive amplifier means includes a plurality of cascade-connected FET amplifier circuits and an amplification degree of at least one of said FET amplifier circuits is controlled by said second control signal produced by said control means.

8. A control circuit according to claim 7, wherein a dual gate FET is used as an FET of said FET amplifier circuit.

9. A control circuit according to claim 1, wherein:
   said transmission output comprises a burst wave having rise and fall portions, and
   said control means includes means for controlling said rise and fall portions and including:
   a ROM that stores data for controlling said rise and fall portions, and
   means, including a D/A converter, for reading said data from said ROM and D/A converting said data to obtain an analog signal which is supplied to said comparator means as said reference signal.

10. A control circuit according to claim 9, wherein:
said first control signal controls a gain of said variable amplifier means in correspondence with a power level of said desired transmission output, and
said detected amplified output of said variable amplifier means and an output of said drive amplifier means, which is controlled by said second control signal, cooperate to control a power level of said transmission output.

11. A control circuit according to claim 1, wherein said detection means comprises a directional coupler.

12. A control circuit according to claim 1, wherein said first control signal controls a gain of said variable amplifier means in one-to-one correspondence with a power level of said desired transmission output.

13. A method for controlling a transmission output, comprising the steps of:
providing a transmission output by driving both a variable drive amplifier means by a high-frequency signal from an oscillation source and a power amplifier means cascade-connected to said variable drive amplifier means;
effecting a feedback loop control by (i) amplifying the transmission output by a variable gain amplifier, (ii) detecting part of the amplified transmission output to obtain a detected output, (iii) comparing said detected output with a reference signal corresponding to a desired transmission output, and (iv) controlling said power amplifier means by a difference output produced by the comparing step, said difference output representing a difference between said detected output and said reference signal; and
effecting feed forward control loop control including (i) controlling an output level of said drive amplifier means in correspondence with said desired transmission output and (ii) controlling a gain of said variable gain amplifier in correspondence with the desired transmission output.

14. A method according to claim 13, further comprising deriving said desired transmission output by receiving and decoding an electric wave for command from a base station.

15. A method according to claim 13, wherein said reference signal comprises a burst wave having rise and fall portions.

16. A method for controlling a transmission output, comprising the steps of:
providing a transmission output by driving both a variable drive amplifier means by a high-frequency signal from an oscillation source and a power amplifier means cascade-connected to said variable drive amplifier means;
effecting a feedback loop control by (i) detecting part of the transmission output to obtain a detected output, (ii) comparing said detected output with a reference signal corresponding to a desired transmission output, and (iii) controlling said power amplifier means by a difference output produced by the comparing step, said difference output representing a difference between said detected output and said reference signal; and
effecting feed forward control loop control of an output level of said drive amplifier means in correspondence with said desired transmission output,
said method further comprising variably amplifying said detected output by an amount dependent upon said desired transmission output.

17. A control circuit, comprising:
means for generating a transmission output by driving both a variable drive amplifier means by a high-frequency signal from an oscillation source and a power amplifier means cascade-connected to said variable drive amplifier means;
means for effecting a feedback loop control by (i) amplifying the transmission output by a variable gain amplifier, (ii) detecting part of said amplified transmission output to obtain a detected output, (iii) comparing said detected output with a reference signal corresponding to a desired transmission output, and (iv) controlling said power amplifier means by a difference output produced by the comparing operation, said difference output representing a difference between said detected output and said reference signal; and
means for effecting feed forward control loop control including (i) controlling an output level of said drive amplifier means in correspondence with said desired transmission output and (ii) controlling a gain of said variable gain amplifier in correspondence with said desired transmission output.

18. A control circuit according to claim 17, wherein:
said transmission output comprises a burst wave having rise and fall portions, and
said control circuit includes means for controlling said rise and fall portions and including:
a ROM that stores data for controlling said rise and fall portions, and
means, including a D/A converter, for reading said data from said ROM and D/A converting said data to obtain an analog signal which is supplied to said means for effecting the closed loop control as said reference signal.

19. A control circuit according to claim 17, wherein said reference signal comprises a burst wave having rise and fall portions.

* * * * *